United States Patent
Kimura et al.

(10) Patent No.: US 6,299,815 B1
(45) Date of Patent: Oct. 9, 2001

(54) PROCESS FOR PRODUCING PIEZOELECTRIC CERAMICS

(75) Inventors: Masahiko Kimura, Kusatsu; Akira Ando, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/640,253

(22) Filed: Aug. 16, 2000

(30) Foreign Application Priority Data

Aug. 16, 1999 (JP) .................................................. 11-229734

(51) Int. Cl.[7] .................................................. B29C 71/00

(52) U.S. Cl. ........................................... 264/235; 264/332

(58) Field of Search ...................................... 264/332, 235

(56) References Cited

FOREIGN PATENT DOCUMENTS 62-091458 * 4/1987 (JP) .

* cited by examiner

*Primary Examiner*—Christopher A. Fiorilla
(74) *Attorney, Agent, or Firm*—Ostrolenk, Faber, Gerb & Soffen, LLP

(57) ABSTRACT

A ceramic composition (sample) includes $CaBi_4Ti_4O_{15}$ or another compound having a layered perovskite crystal structures and exhibiting ferroelectricity at ordinary temperature. The ceramic composition (sample) is then heated to a temperature higher than the melting point of the ceramic composition to make the ceramic composition molten or semi-molten. The ceramic composition is then annealed and solidified to yield a grain oriented ceramic (porcelain). This process can produce grain oriented ceramics from ceramic compositions mainly containing a compound having a layered perovskite crystal structure, and can improve electromechanical coefficients of piezoelectric ceramics containing a compound having a layered perovskite crystal structure.

12 Claims, 2 Drawing Sheets

PROCESS FOR PRODUCING PIEZOELECTRIC CERAMICS

BACKGROUND OF THE INVENTION

1. Field of the Invention

The present invention relates to a process for producing piezoelectric ceramics. Particularly, the invention relates to a process for producing piezoelectric ceramics which are useful as materials for, for example, piezoelectric ceramic filters, piezoelectric ceramic resonators and other piezoelectric ceramic devices.

2. Description of the Related Art

Piezoelectric ceramics mainly containing lead titanate zirconate ($PbTi_xZr_{1-x}O_3$) or lead titanate ($PbTiO_3$) have been widely used as piezoelectric ceramics for piezoelectric ceramic filters, piezoelectric ceramic resonators and other piezoelectric ceramic devices.

Piezoelectric ceramics having a layer perovskite structure, such as $CaBi_4Ti_4O_{15}$ or $PbBi_4Ti_4O_{15}$ have higher heat resistance and lower loss at high frequency than the piezoelectric ceramics mainly containing lead titanate zirconate or lead titanate. The former piezoelectric ceramics are expected to be materials for piezoelectric resonators for use at high temperatures or at high frequency.

However, piezoelectric ceramics having a layer perovskite structure include highly anisotropic crystals and cannot yield a high electromechanical coefficient if they are produced by conventional processes for producing piezoelectric ceramics.

As possible solutions to this problem, some processes have been proposed. In these processes, the crystallographic axis of a piezoelectric ceramic mainly containing a compound having a layered perovskite crystal structure is preferably oriented in a uniaxial direction by using the crystal anisotropy of the compound to yield a high electromechanical coefficient. For example, T. TAKENAKA et al. reported that a c-axis oriented ceramic made of $PbBi_4Ti_4O_{15}$ is prepared by hot forging technique and that the resulting ceramic has an electromechanical coefficient $k_{33}$ about 1.6 times higher than a sample prepared by a conventional process for producing piezoelectric ceramics (J. Appl. Phys., Vol. 55, No. 4 (1984) P.1092). H. WATANABE et al. reported that a powered $Bi_4Ti_3O_{12}$ having anisotropic dimensions is prepared by the flux method and the powder having anisotropic dimensions is tape cast to orient the powder, and the grain oriented powder is fired to yield a c-axis oriented ceramic made of $Bi_4Ti_3O_{12}$ (J. Am. Ceram. Soc., Vol. 72, No. 2 (1989) P.289). T. TANI et al. reported that a c-axis oriented ceramic of $CaBi_4Ti_4O_{15}$ is prepared by adding powdered $TiO_2$, $Bi_2O_3$ and $CaCo_3$ to a powdered $Bi_4Ti_3O_{12}$ having anisotropic dimensions, subjecting the resulting mixture to tape casting to orient the powder having anisotropic dimensions, and firing the grain oriented powder, and that the resulting c-axis oriented ceramic has an electromechanical coefficient $k_{33}$ about three times higher than a sample prepared by a conventional process for producing piezoelectric ceramics (Proceedings of Presentations, The 16th Ferroelectric Application Conference, (1999) p.35).

The hot forging technique, however, requires firing with uniaxial pressing in the production of such a piezoelectric ceramic, requires expensive firing furnaces and kilns and exhibits a lower productivity as compared with conventional processes for producing piezoelectric ceramics. The hot forging technique has therefore not yet been in wide practical use.

In the processes for producing oriented ceramics using powders having anisotropic dimensions, impurities are liable to contaminate material powders having anisotropy in the production step. In addition, these processes require a preparation step of an anisotropic powder and thus require complicated production steps as compared with conventional processes for producing piezoelectric ceramics. These processes have therefore not yet been in wide practical use.

SUMMARY OF THE INVENTION

Accordingly, it is a main object of the invention to provide a process for producing piezoelectric ceramics, which can produce grain oriented ceramics from ceramic compositions mainly containing a compound having a layered perovskite crystal structure, and can improve the electromechanical coefficient of piezoelectric ceramics mainly containing a compound having a layered perovskite crystal structure.

The invention provides a process for producing piezoelectric ceramics. This process includes the steps of heating a ceramic composition at a temperature higher than the melting point of the ceramic composition to make the ceramic composition molten or semi-molten, which ceramic composition mainly contains a compound having a layered perovskite crystal structure exhibiting ferroelectricity at ordinary temperature, and annealing and solidifying the molten or semi-molten ceramic composition to form a grain oriented ceramic.

In the invented process, the ceramic composition main component preferably includes bismuth.

The ceramic composition in the invented process preferably includes at least one of, for example, $Bi_2WO_6$, $CaBi_2Nb_2O_9$, $SrBi_2Nb_2O_9$, $BaBi_2Nb_2O_9$, $PbBi_2Nb_2O_9$, $CaBi_2Ta_2O_9$, $SrBi_2Ta_2O_9$, $BaBi_2Ta_2O_9$, $PbBi_2Ta_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Ca_2Bi_4Ti_5O_{18}$, $Sr_2Bi_4Ti_5O_{18}$, $Ba_2Bi_4Ti_5O_{18}$, $Pb_2Bi_4Ti_5O_{18}$, $Bi_6Ti_3WO_{18}$, $Bi_7Ti_4NbO_{21}$ and $Bi_{10}Ti_3W_3O_{30}$.

According to the invented process for producing piezoelectric ceramics, a compound having a layered perovskite crystal structure exhibiting ferroelectricity at ordinary temperature is oriented to yield a piezoelectric ceramic having a high electromechanical coefficient.

The new process can be performed in conventionally employed firing furnaces and kilns for the production of piezoelectric ceramics, and requires no extra facilities. In addition, the new process can employ conventional materials for use in the production of conventional piezoelectric ceramics. The invented process can more easily produce grain oriented ceramics at lower cost than the hot forging technique or the processes using a powder having anisotropic dimensions.

According to the invented process for producing piezoelectric ceramics, the temperature for making a material ceramic composition molten or semi-molten can be set at a temperature slightly higher than the melting point of the ceramic composition. By this procedure, even if processing is required after annealing, the processing operation can be easily performed. At a temperature slightly higher than the melting point of the ceramic composition, crystal grains of the ceramic composition can be moved or deformed to orient, the overall dimensions of the ceramic composition are not significantly changed as compared with those prior to heating, and the ceramic composition does not firmly adhere to a sagger or to a refractory powder. The sagger serves to house or hold the ceramic composition, and the refractory powder is placed between the sagger and the ceramic composition (sample) to prevent seizure.

Further objects, features, and advantages of the present invention will become apparent from the following description of the preferred embodiments with reference to the attached drawings.

DESCRIPTION OF THE PREFERRED EMBODIMENTS

EXAMPLE

Figure 1:
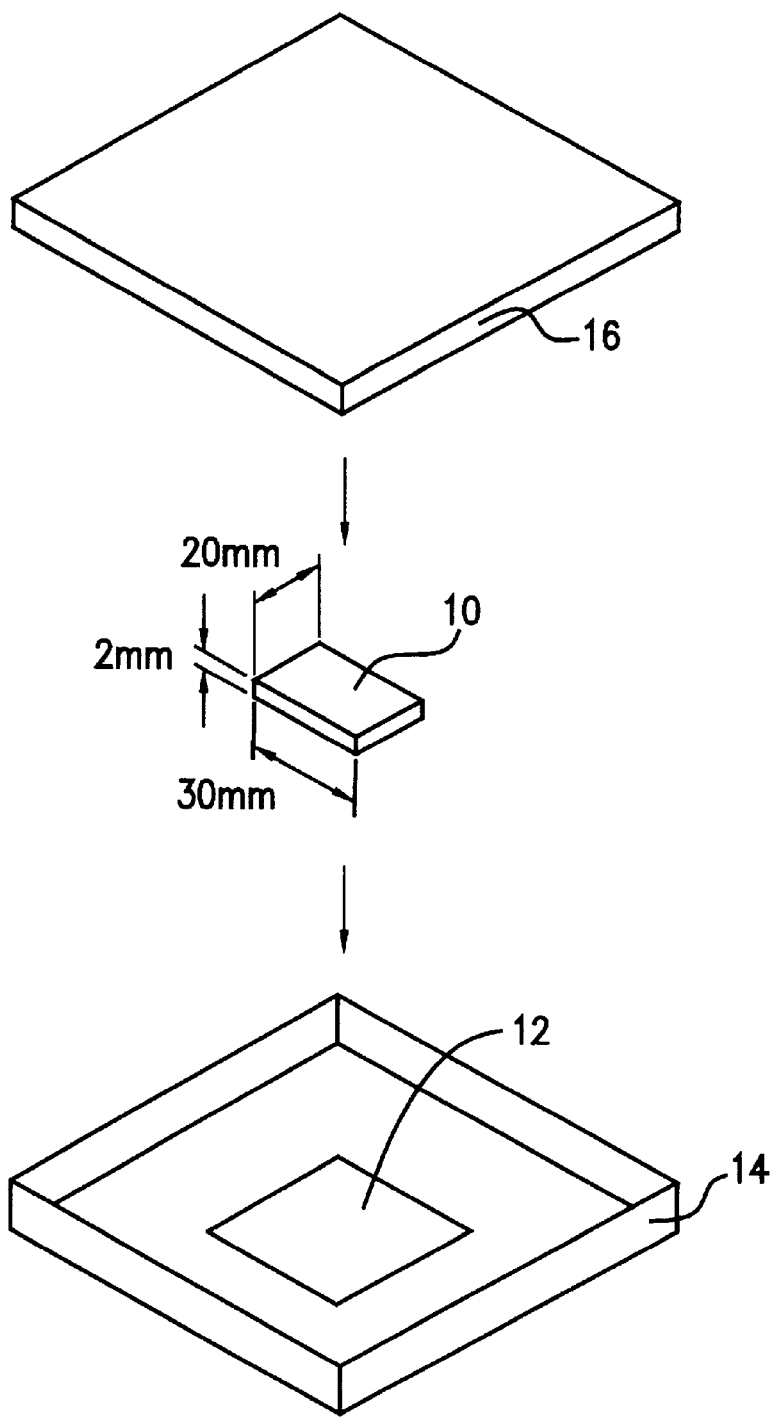
FIG. 1 is an illustration showing an arrangement of a sample in an embodiment according to the invention.

Starting materials $CaCO_3$, $Bi_2O_3$, $TiO_2$ and $MnCO_3$ were weighed and mixed to yield a powdered mixture with a composition of $CaBi_4Ti_4O_{15}+0.5$ wt % $MnO_2$, and the powdered mixture was calcined at 800° C. The calcined powder was wet-milled with an appropriate amount of an organic binder in a ball mill for four hours, and was passed through a 40-mesh sieve to adjust the grain size of the milled powder. The resulting powder was molded at a pressure of 1000 $kgf/cm^2$ into a rectangular plate sample 30 mm long, 20 mm wide and 2 mm thick. The sample was heated at 500° C. in the air to remove the organic binder. As shown in FIG. 1, powdered zirconia 12 for preventing seizure was scattered on an alumina sagger 14, and the rectangular plate sample 10 was placed on the alumina sagger 14 in such a manner that the 30 mm×20 mm plane of the sample faced downward. On the sample, an alumina cover plate 16 was placed, and the sample 10 was then heated to 1265° C. at a heating rate of 2° C./min and was held at this temperature for 10 minutes in an electric furnace. The temperature 1265° C. was slightly higher than the 1245° C. temperature at which the ceramic composition (sample 10) began to melt. The sample 10 was then annealed to room temperature at a cooling rate of 1° C./min and was solidified in the same electric furnace to yield a rectangular plate ceramic (Sample A).

Comparative Example

A rectangular plate sample was prepared by repeating the above procedure until the organic binder was removed. The prepared sample was fired at 1150° C. (a conventional production process) to yield a rectangular plate ceramic (Sample B) having a relative density of about 95%.

Figure 2A:
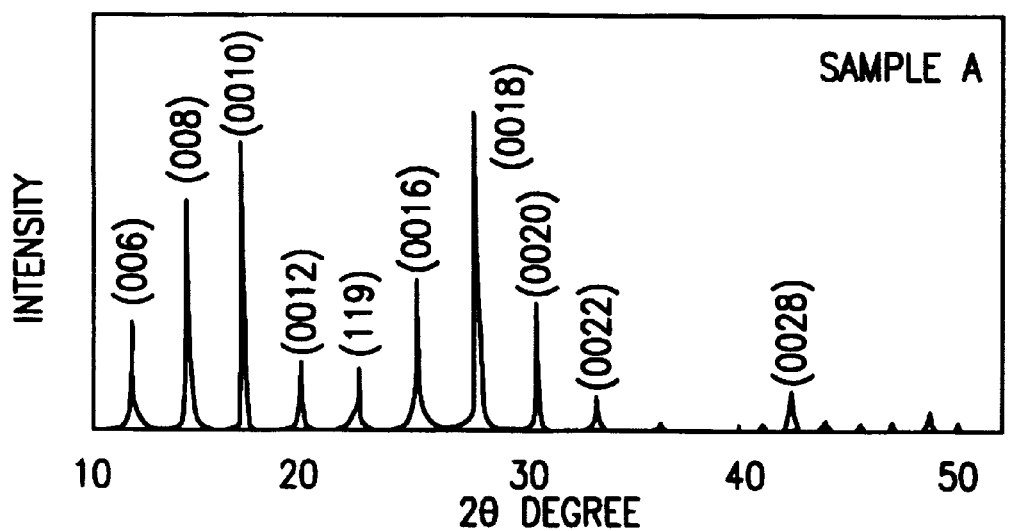
FIG. 2A is an X-ray diffraction profile ol Sample A according to the invention.
Figure 2B:
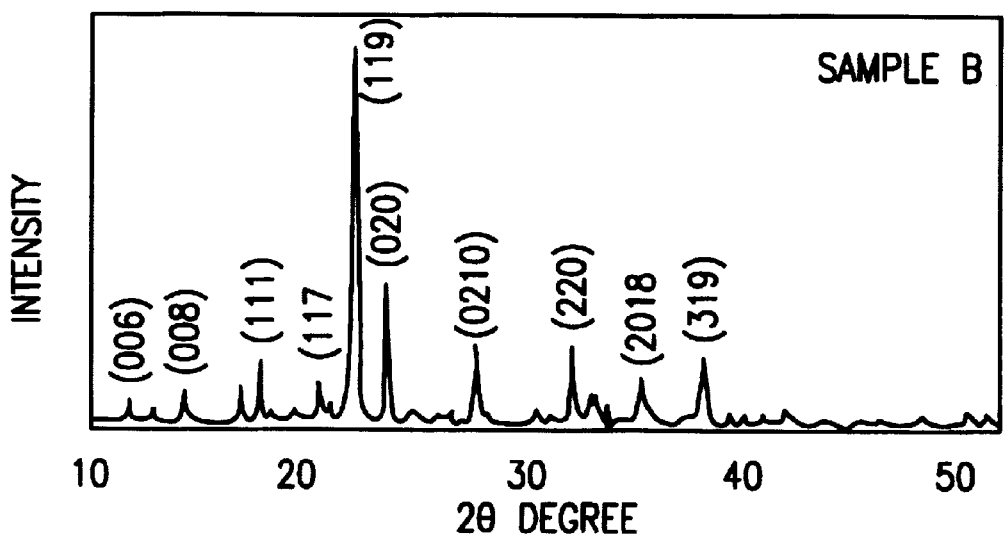
FIG. 2B is an X-ray diffraction profile of Sample B according to a comparative example.

FIGS. 2A and 2B are X-ray diffraction profiles of the surfaces (30 mm×20 mm faces facing upwards in the heating procedure) of Sample A and Sample B, respectively. In the profile of Sample A, the peak intensity of the (001) plane is significantly strong, indicating a clear c-axis orientation. In contrast, Sample B showed no significant orientation.

With reference to powders each obtained by grinding Sample A or Sample B, degrees of preferred orientation F were determined by the Lotgering method. Sample B showed F of less than 10%, and in contrast, Sample A showed F of 90%.

Each of Samples A and B was then processed into a rectangular column 1 mm long, 1 mm wide and 3 mm high. In this procedure, the rectangular column was cut in such a manner that the height direction of the rectangular column was in parallel with both principal planes of Samples A and B. A silver paste was applied to and baked on both principal planes (1 mm×1 mm planes) of the rectangular column to form silver electrodes. The rectangular column was then subjected to a polarization treatment by the application of a direct-current voltage of 10 kV/mm in the height direction for 30 minutes in a 200° C. insulating oil. Thus, piezoelectric ceramics Samples C and D were obtained. Sample C was obtained from a rectangular column cut from Sample A, and Sample D was obtained from a rectangular column cut from Sample B. The electromechanical coefficients $k_{33}$ of these Samples C and D were determined. Sample C had $k_{33}$ of 32.2% and Sample D had $k_{33}$ of 14.6%.

The above procedures were repeated on compositions of $PbBi_4Ti_4O_{15}+0.5$ wt % $MnO_2$ and of $Na_{0.5}Bi_{4.5}Ti_4O_{15}+0.5$ wt % $MnO_2$. The results are shown in Table 1 together with the results of the composition of $CaBi_4Ti_4O_{15}+0.5$ wt % $MnO_2$.

TABLE 1

| Composition | | Degree of Preferred Orientation F (%) | Electromechanical Coefficient $k_{33}$ (%) |
|---|---|---|---|
| $CaBi_4Ti_4O_{15}$ + 0.5 wt % $MnO_2$ | Conventional Process | <10 | 14.6 |
| | Inverted Process | 95 | 32.2 |
| $PbBi_4Ti_4O_{15}$ + 0.5 wt % $MnO_2$ | Conventional Process | <10 | 17.6 |
| | Inverted Process | 90 | 31.1 |
| $Na_{0.5}Bi_{4.5}Ti_4O_{15}$+ 0.5 wt % $MnO_2$ | Conventional Process | <10 | 20.1 |
| | Inverted Process | 97 | 35.1 |

Table 1 shows that the invented production process can yield grain-oriented ceramics and can improve electromechanical coefficients of piezoelectric ceramics containing a compound having a layered perovskite crystal structure, and can provide piezoelectric ceramics which are useful as materials for, for example, piezoelectric ceramic filters, piezoelectric ceramic resonators and other piezoelectric ceramic devices.

In the above examples, an electric furnace was used for heating samples, but the heating technique is not critical in the invention and high frequency furnaces, infrared convergent furnaces, laser light and other heating means can be used according to necessity instead of electric furnaces.

The annealing and solidifying technique is not limited to a process of annealing and solidifying in an electric furnace as in the examples, and any other techniques can be employed according to necessity.

In the examples, ceramic compositions were heated at a temperature slightly higher than the melting point of the ceramic composition, i.e., about 30° C. or less higher, but the temperature can be modified according to necessity as long as the temperature is higher than the melting point.

As compounds having a layered perovskite crystal structure, compositions obtained by adding Mn to a main component, $CaBi_4Ti_4O_{15}$, $PbBi_4Ti_4O_{15}$ or $Na_{0.5}Bi_{4.5}Ti_4O_{15}$ were indicated in the examples. However, the invented process for producing piezoelectric ceramics utilizes the crystal anisotropy of a compound having a layered perovskite crystal structure, and advantages thereof are not limited to the aforementioned compositions. The invention is also effective for other compounds having layered perovskite crystal structure, compositions mainly containing these compounds and additionally containing Si or W, or compositions in which part of these components was replaced with another component. Such compounds having a layered perovskite crystal structure include, but are not limited to, $Bi_2WO_6$, $CaBi_2Nb_2O_9$, $SrBi_2Nb_2O_9$, $BaBi_2Nb_2O_9$, $PbBi_2Nb_2O_9$, $CaBi_2Ta_2O_9$, $SrBi_2Ta_2O_9$, $BaBi_2Ta_2O_9$, $PbBi_2Ta_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Ca_2Bi_4Ti_5O_{18}$, $Sr_2Bi_4Ti_5O_{18}$, $Ba_2Bi_4Ti_5O_{18}$, $Pb_2Bi_4Ti\ O_{18}$, $Bi_6Ti_3WO_{18}$, $Bi_7Ti_4NbO_{21}$ and $Bi_{10}Ti_3W_3O_{30}$.

As thus described, the invented process can produce grain oriented ceramics from ceramic compositions mainly containing a compound having a layered perovskite crystal structure and can improve electromechanical coefficients of piezoelectric ceramics mainly containing a compound having a layered perovskite crystal structure. Accordingly, piezoelectric ceramics which are useful as materials for, for example, piezoelectric ceramic filters, piezoelectric ceramic resonators, and other piezoelectric ceramic devices can be obtained.

Other embodiments and variations will be obvious to those skilled in the art, and this invention is not to be limited to the specific matters stated above.

What is claimed is:

1. A process for producing a grain oriented piezoelectric ceramic comprising:

providing a powdered ceramic composition having a melting point, molding the powdered ceramic composition, heating the molded ceramic composition at a temperature higher than the melting point of said ceramic composition so as to make said ceramic composition molten or semi-molten, said heated ceramic composition comprising a compound having a layered perovskite crystal structure and exhibiting ferroelectricity at ambient temperature, and annealing and solidifying said molten or semi-molten ceramic composition to form a grain oriented piezoelectric ceramic.

2. A process according to claim 1, wherein said ceramic composition comprises $MnO_2$.

3. A process according to claim 2, wherein said heating is to a temperature 30° C. or less higher than said melting point.

4. A process according to claim 1, wherein said ceramic composition comprises bismuth.

5. A process according to claim 4, wherein said ceramic composition comprises $MnO_2$.

6. A process according to claim 5, wherein said heating is to a temperature 30° C. or less higher than said melting point.

7. A process according to claim 5, wherein said heating is to a temperature 30° C. or less higher than said melting point.

8. A process according to claim 4, wherein said ceramic composition comprises at least one member selected from the group consisting of $Bi_2WO_6$, $CaBi_2Nb_2O_9$, $SrBi_2Nb_2O_9$, $BaBi_2Nb_2O_9$, $PbBi_2Nb_2O_9$, $CaBi_2Ta_2O_9$, $SrBi_2Ta_2O_9$, $BaBi_2Ta_2O_9$, $PbBi_2Ta_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Ca_2Bi_4Ti_5O_{18}$, $Sr_2Bi_4Ti_5O_{18}$, $Ba_2Bi_4Ti_5O_{18}$, $Pb_2Bi_4Ti_5O_{18}$, $Bi_6Ti_3WO_{18}$, $Bi_7Ti_4NbO_{21}$ and $Bi_{10}Ti_3W_3O_{30}$.

9. A process according to claim 8, wherein said ceramic composition comprises $MnO_2$.

10. A process according to claim 9, wherein said heating is to a temperature 30° C. or less higher than said melting point.

11. A process according to claim 8, wherein said heating is to a temperature 30° C. or less higher than said melting point.

12. A process according to claim 1, wherein said heating is to a temperature 30° C. or less higher than said melting point.

* * * * *